United States Patent
Onuma

(10) Patent No.: US 6,652,310 B2
(45) Date of Patent: Nov. 25, 2003

(54) CONNECTING MEMBER FOR FLAT CIRCUIT MEMBER AND METHOD OF CONNECTING THE CONNECTING MEMBER AND THE FLAT CIRCUIT MEMBER

(75) Inventor: Masanori Onuma, Haibara-gun (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 10/321,803

(22) Filed: Dec. 18, 2002

(65) Prior Publication Data

US 2003/0114041 A1 Jun. 19, 2003

(30) Foreign Application Priority Data

Dec. 19, 2001 (JP) .................................. P2001-386320

(51) Int. Cl.[7] .................................................. H01R 4/24
(52) U.S. Cl. ........................ 439/422; 439/421; 439/423; 439/426
(58) Field of Search ................................. 439/426, 422, 439/421, 423

(56) References Cited

U.S. PATENT DOCUMENTS 3,715,457 A * 2/1973 Teagno et al. ............ 174/88 R
5,137,468 A * 8/1992 Murakami .................. 439/422

FOREIGN PATENT DOCUMENTS

JP     4-8372 U    1/1992

* cited by examiner

Primary Examiner—Dean A. Reichard
Assistant Examiner—Jinhee J Lee
(74) Attorney, Agent, or Firm—Sughrue Mion, PLLC

(57) ABSTRACT

A claw portion (26) of a connecting member (21) penetrates a first piercing portion of a flat circuit member (100, 110) in a thickness direction thereof. In the case of connection to the flat circuit member having a thick conductor portion (102), the claw portion is bent such that a distal end portion of the claw portion pierces the flat circuit member so as to obtain electric contact with the conductor portion of the flat circuit member. In the case of connection to the flat circuit member having a thin conductor portion (112), the claw portion is bent such that a portion of the flat circuit member is clamped between an outer surface (28) of the claw portion and an inner edge portion (27) of a side wall portion (25) of the connecting member, so as to obtain electric contact with the conductor portion of the flat circuit member.

2 Claims, 14 Drawing Sheets

CONNECTING MEMBER FOR FLAT CIRCUIT MEMBER AND METHOD OF CONNECTING THE CONNECTING MEMBER AND THE FLAT CIRCUIT MEMBER

BACKGROUND OF THE INVENTION

The present invention relates to a connecting member for a flat circuit member and a method of connecting the connecting member and the flat circuit member, and more particularly to a connecting member for a flat circuit member which can be electrically connected reliably to a conductor portion in a flat circuit member such as a flexible printed circuit (FPC), a flexible flat cable (FFC), and a ribbon cable as well as a method of connecting the same.

Referring to FIGS. 18, 19, and 20, a description will be given of a conventional connecting member disclosed in JP-A-4-8372U. FIG. 18 is a perspective view illustrating a connecting member (electric connection member) 1; FIG. 19 is a cross-sectional view, taken in the direction of arrows along line XIX—XIX, of the connecting member 1 shown in FIG. 18 and illustrating the cross section of a flat circuit member (FFC) 10; and FIG. 20 is an enlarged cross-sectional view illustrating a state in which the connecting member 1 is used.

As shown in FIG. 18, the connecting member 1 has a bottom plate portion (proximal portion) 2, a plurality of claw portions (crimping pieces) 3 rising from both side edges of the bottom plate portion 2 in the thickness direction, and an arcuate contact portion 4 provided projectingly on the bottom plate portion 2.

When the connecting member 1 is connected to the flat circuit member 10, after the connecting member 1 is first located below the flat circuit member 10, the claw portions 3 of the connecting member 1 are caused to penetrate first piercing portions (portions of an insulating portion (insulating coating) 11 in FIG. 19) of the flat circuit member 10 as shown in FIG. 19. Subsequently, the claw portions 3 are bent toward the bottom plate portion 2 in such a manner as to clamp the flat circuit member 10 between the arcuate contact portion 4 on the bottom plate portion 2 and the claw portions 3. At this time, as shown in FIG. 20, the insulating portion 11 of the flat circuit member 10 clamped between the claw portions 3 and a concave arcuate surface 5 formed in advance on the arcuate contact portion 4 is peeled off by distal edges of the claw portions 3. A conductor portion 12 of the flat circuit member 10 thereby exposed and the claw portions 3 of the connecting member 1 are brought into contact with each other, thereby electrically connecting the flat circuit member 10 and the connecting member 1.

Incidentally, if it is assumed that, as shown in FIG. 20, the width of the connecting member 1 is W1, the bent width W2 of the claw portion 3 which is bent with a dimension of curl R becomes approximately one half of the just-mentioned width W1 of the connecting member 1 (i.e., W2≈W1÷2).

Although a description has been given above of the connection of one connecting member 1 to one conductor portion 12 formed in the flat circuit member 10 by referring to FIGS. 18 to 20, actually there are cases where a plurality of conductor portions 12 are formed in or on the flat circuit member 10 (see FIGS. 19 and 20). In this case, the plurality of connecting members 1 are respectively connected, as described above, to the plurality of conductor portions 12 requiring connection.

In a case where the interval between adjacent ones of the plurality of conductor portions 12 in the flat circuit member 10 is small and the width of each conductor portion 12 is narrow, each connecting member 1 must be made compact correspondingly. However, in conjunction with this miniaturization, the width W1 of the connecting member 1 becomes narrow, and therefore the dimension of curl R of the claw portion 3 must also be made small. In such a connecting member 1, there is a possibility that it becomes difficult to bend the claw portion 3 smoothly. In addition, since the width W1 of the connecting member 1 becomes narrow (i.e., the width of the bottom plate portion 2 becomes narrow), it becomes difficult to form the arcuate contact portion 4 on the bottom plate portion 2. Accordingly, there is a possibility that it becomes impossible to obtain stable electric contact between the claw portion 3 and the conductor portion 12. Even if the flat circuit members 10 with a plurality of such contact members 1 are manufactured, their quality control is troublesome or difficult, thereby resulting in an increase in the manufacturing cost.

SUMMARY OF THE INVENTION

The invention has been made in view of the above-described problems, and its object is to provide a connecting member for a flat circuit member which can be electrically connected reliably to a conductor portion in a flat circuit member and can ensure stable connection even in a case where the interval between adjacent ones of a plurality of conductor portions in the flat circuit member is small and the width of each conductor portion is narrow, as well as a method of connecting the connecting member and the flat circuit member.

In order to solve the aforesaid object, the invention is characterized by having the following arrangement.

(1) A connecting member for a flexible flat circuit member, comprising:
   a bottom plate portion;
   at least one side wall portion extending upward from one side edge of the bottom plate portion; and
   at least one claw portion extending from the other side edge of the bottom plate portion so as to oppose to the side wall portion,
   wherein the claw portion penetrates a first piercing portion of the flat circuit member having a conductor portion in a thickness direction of the flat circuit member, and the claw portion is bent so that a distal end portion of the claw portion pierces a second piercing portion of the flat circuit member which is different from the first piercing portion so as to obtain electric contact with the conductor portion,
   wherein the side wall portion supports the flat circuit member, and
   wherein the second piercing portion is located in a vicinity of the side wall portion.

(2) The connecting member according to (1), wherein an edge portion of the side wall portion is chamfered.

(3) The connecting member according to (1), wherein the side wall portion partially supports the flat circuit member.

(4) The connecting member for a flat circuit member, comprising:
   a bottom plate portion;
   at least one side wall portion extending upward from one side edge of the bottom plate portion; and
   at least one claw portion extending from the other side edge of the bottom plate portion so as to oppose to the side wall portion, wherein the claw portion penetrates a portion of the flat circuit member having a conductor portion in a thickness direction of the flat circuit member, and wherein the claw portion is bent such that a portion of the flat circuit member is clamped between an outer surface of the claw portion and an inner edge portion of the side wall portion so as to obtain electric contact with the conductor portion.

(5) The connecting member according to (4), wherein the inner edge portion of the side wall portion is chamfered.

(6) A method of connecting a connector member to a flat circuit member including a conductor portion, wherein the connecting member includes a bottom plate portion, at least one side wall portion extending upward from one side edge of the bottom plate portion, and at least one claw portion extending from the other side edge of the bottom plate portion so as to oppose to the side wall portion, the method comprising the steps of:

causing the claw portion to penetrate a first piercing portion of the flat circuit member in a thickness direction of the flat circuit member; and bending the claw portion such that a distal end portion of the claw portion pierces a second piercing portion of the flat circuit member which is different from the first piercing portion of the flat circuit member, so as to obtain electric contact with the conductor portion, wherein the side wall portion supports the flat circuit member, and the second piercing portion is located in a vicinity of the side wall portion.

(7) A method of connecting a connecting member to a flat circuit member including a conductor member, wherein the connecting member includes a bottom plate portion, at least one side wall portion extending upward from one side edge of the bottom plate portion, and at least one claw portion extending from the other side edge of the bottom plate portion so as to oppose to the side wall portion, the method comprising the steps of:

causing the claw portion to penetrate a portion of the flat circuit member in a thickness direction of the flat circuit member; and bending the claw portion such that a portion of the flat circuit member is clamped between an outer surface of the claw portion and an inner edge portion of the side wall portion, so as to obtain electric contact with the conductor portion.

In The present disclosure relates to the subject matter contained in Japanese patent application Nos. 2000-386320 (filed on Dec. 19, 2001), which is expressly incorporated herein by reference in their entireties.

DETAILED DESCRIPTION OF PREFERRED EMBODIMENTS

Hereafter, a detailed description will be given of a preferred embodiment of the invention with reference to the accompanying drawings.

First Embodiment

Figure 1A:
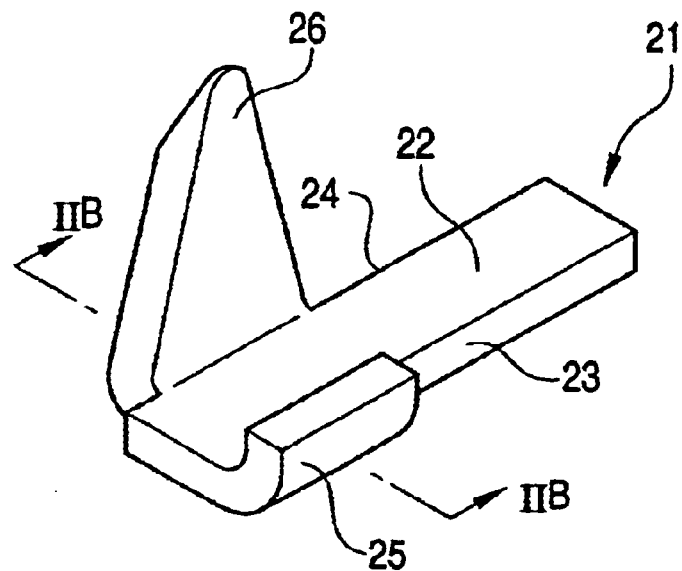
FIG. 1A is a perspective view illustrating the configuration of a connecting member in accordance with a first embodiment of the invention.
Figure 1B:
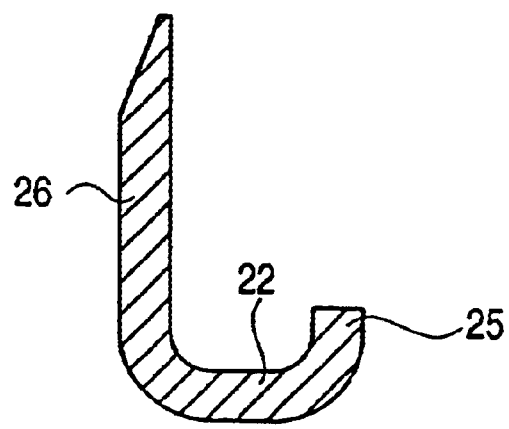
FIG. 1B is a cross-sectional view taken in the direction of arrows along line IIB—IIB in FIG. 1A.

FIG. 1A is a perspective view illustrating the configuration of a connecting member 21 in accordance with a first embodiment of the invention, and FIG. 1B is a cross-sectional view taken in the direction of arrows along line IIB—IIB in FIG. 1A.

As shown in FIGS. 1A and 1B, the whole of the connecting member 21 is integrally formed by subjecting an appropriate electrically conductive metal plate to press forming. The connecting member 21 has a bottom plate portion 22, a side wall portion 25 extending upward from a widthwise side edge 23 of the bottom plate portion 22 substantially in parallel with the thickness direction of the bottom plate portion 22, and a claw portion 26 extending upward from the other side 24 of the bottom plate portion 22 substantially in parallel with the thickness direction of the bottom plate portion 22 in such a manner as to oppose the side wall portion 25. The claw portion 26 is tapered.

Figure 2A:
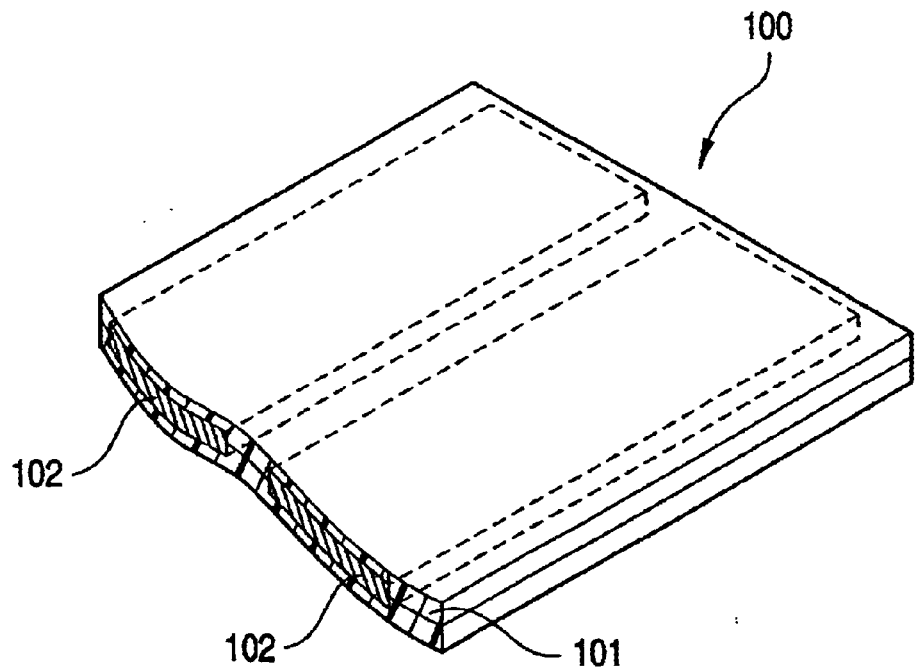
FIGS. 2A and 2B are partially cutaway views of two types of flat circuit members, respectively.
Figure 2B:
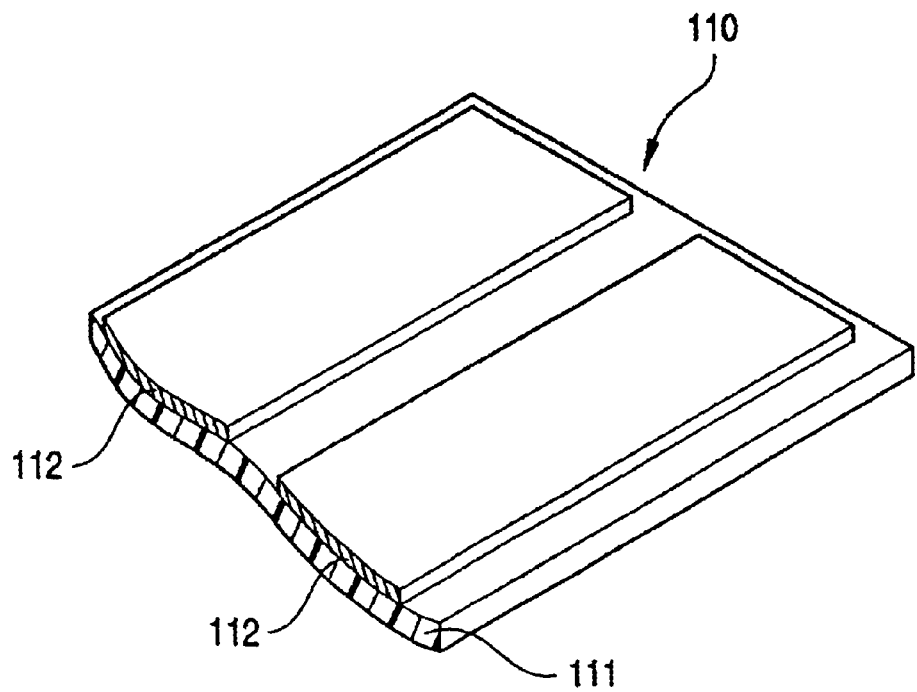

As a flat circuit member which is connected to the connecting member 21 of the invention thus constructed, it is possible to cite flexible flat circuit members having conductor portions, such as a flexible printed circuit (FPC), a flexible flat cable (FFC), and a ribbon cable. FIGS. 2A and 2B illustrate an example of the flat circuit member. FIG. 2A is a partially cutaway view of a flat circuit member 100, and FIG. 2B is a partially cutaway view of a flat circuit member 110.

The flat circuit member 100 shown in FIG. 2A has thick conductor portions 102, whereas the flat circuit member 110 shown in FIG. 2B has thin conductor portions 112. Further, in the flat circuit member 100, each conductor portion 102 is covered with an insulating portion 101 and is insulated from the outside, whereas in the flat circuit member 110 each conductor portion 112 is formed on an insulating portion 111. It should be noted, however, that the flat circuit member which is connected to the connecting member of the invention is not limited to the flat circuit member 100 and the flat circuit member 110. Namely, it should be construed that there are various forms in the configuration of the flat circuit member, the circuit pattern of the conductor portions formed in or on the flat circuit member, and so forth. For example, if the example of the flat circuit member 100 shown in FIG. 2A is cited, the thick conductor portions 102 may be formed on the insulating portion as in the flat circuit member 110 shown in FIG. 2B. In addition, the flat circuit member which is connected to the connecting member of the invention may adopt a form in which the conductor portions are partially exposed from the insulating portion in various forms.

When the connecting member 21 is connected to the flat circuit member, the connecting member 21 is first positioned below the flat circuit member, and the claw portion 26 is subsequently caused to penetrate a first piercing portion of the flat circuit member in the thickness direction thereof.

Figure 3A:
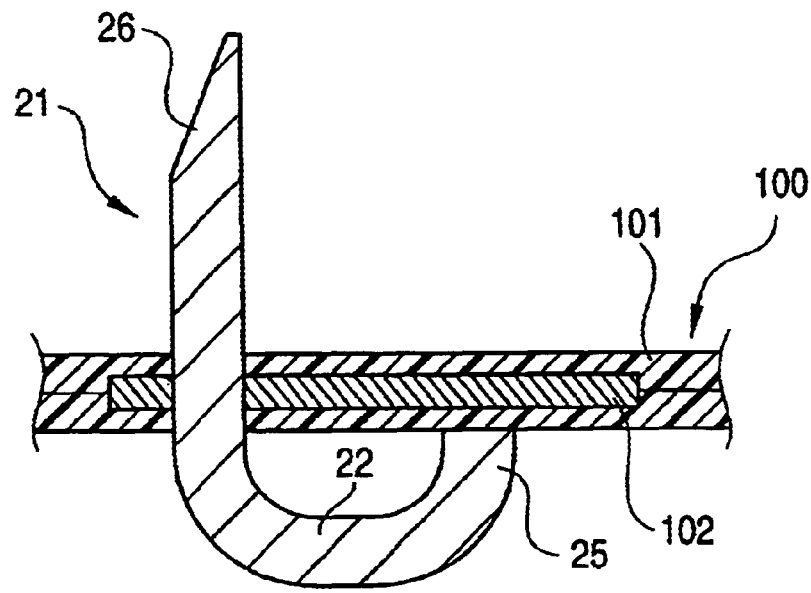
FIGS. 3A and 3B are diagrams illustrating states in which the connecting members have respectively penetrated the two types of flat circuit members shown in FIGS. 2A and 2B.
Figure 3B:
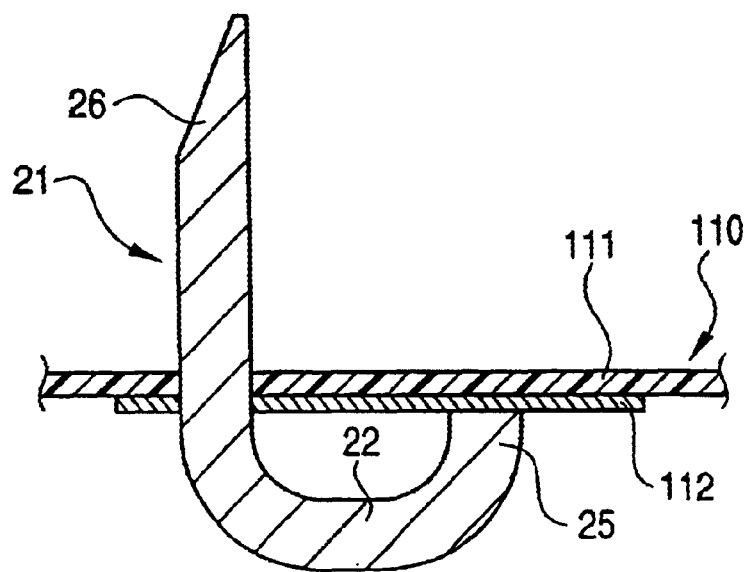

FIG. 3A shows a state in which the connecting member 21 has penetrated a first piercing portion (in this example, a portion where the conductor portion and the insulating portion are present) of the flat circuit member 100, and FIG. 3B shows a state in which the connecting member 21 has penetrated a first piercing portion (in this example, a portion where the conductor portion and the insulating portion are present) of the flat circuit member 110. It should be noted that FIG. 3B shows an example in which the claw portion 26 has penetrated the flat circuit member 110 while the conductor portion 112 exposed on the flat circuit member 110 is oriented toward the bottom plate portion 22 of the connecting member 21.

The first piercing portion of the flat circuit member, which is penetrated by the claw portion 26 of the connecting member 21, may include both the insulating portion and the conductor portion, as shown in FIGS. 3A and 3B, but the first piercing portion may not necessarily include the conductor portion. Namely, it is not necessarily essential for the portion of the flat circuit member where the conductor portion is present to be penetrated by the claw portion 26 of the connecting member 21, and the portion of the flat circuit member where only the insulating portion is present may be penetrated in the thickness direction thereof. However, consideration should be given to the fact that a greater number of electric contacts are obtained as the claw portion 26 penetrates the conductor portion and is brought into contact with the cross section of the conductor portion. Of course, the portion of the flat circuit member where only the conductor portion is present may be penetrated in the thickness direction thereof.

Figure 4A:
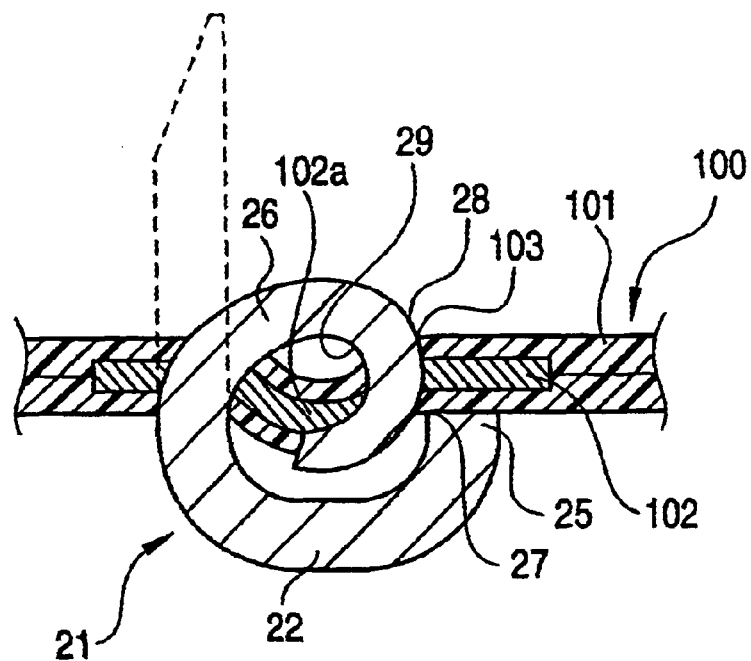
FIGS. 4A and 4B are diagrams illustrating states in which the claw portions of the connecting members are respectively connected to the conductor portions of the flat circuit members from the states shown in FIGS. 3A and 3B.
Figure 4B:
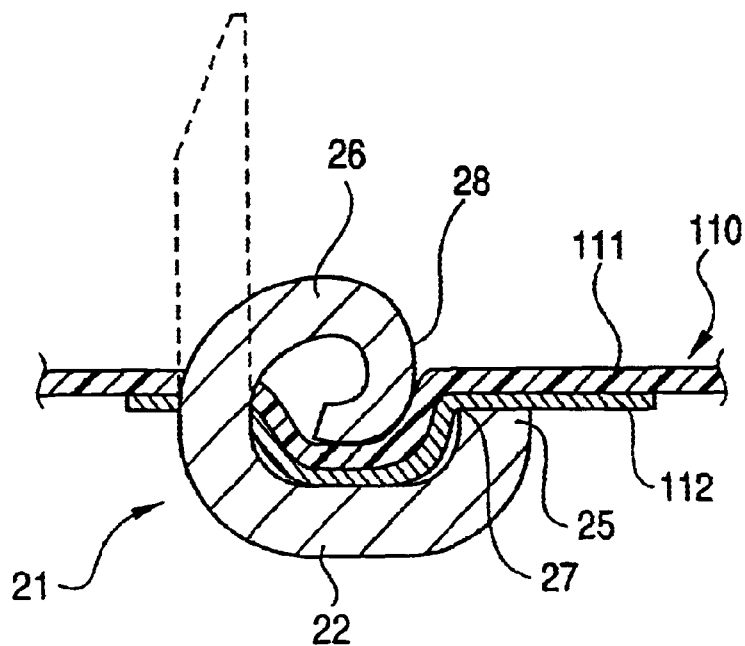

Referring to FIGS. 4A and 4B, the electric connection of the connecting member 21 will be described separately with respect to (i) the case of connection to the flat circuit member 100 having the thick conductor portions 102 and (ii) the case of connection to the flat circuit member 110 having the thin conductor portions 112.

(i) Case of Electric Connection to the Flat Circuit Member 100

By using a predetermined crimping machine in the state of FIG. 3A, the claw portion 26 is bent toward the bottom plate portion 22 such that a distal end portion of the claw portion 26 pierces a second piercing portion 103 of the flat circuit member 100 which is different from the aforementioned first piercing portion of the flat circuit member 100. At this time, the claw portion 26 is particularly bent such that the distal end portion of the claw portion 26 pierces the conductor portion 102. Consequently, a portion 102a of the conductor portion 102 located on the inner side of the bent claw portion 26 is clamped by an inner surface 29 of the claw portion 26, thereby making it possible to obtain electric contact between the cross section of the conductor portion 102 and the inner surface 29 of the claw portion 26. It should be noted that if the portion 102a is clamped by the inner surface 29 of the claw portion 26 such that the portion 102a of the conductor portion 102 located on the inner side of the bent claw portion 26 becomes strained (i.e., deflected), the force for holding the contact between the cross section of the conductor portion 102 and the inner surface 29 of the claw portion 26 is generated or increased, thereby making it possible to obtain much more stable electric contact between the connecting member 21 and the flat circuit member 100. In the connection between the connecting member 21 and the flat circuit member 100, the side wall portion 25 forms a space between the bottom plate portion 22 and the flat circuit member 100 in cooperation with the bottom plate portion 22, as shown in FIG. 4A. The side wall portion 25 partially supports the bottom surface of the flat circuit member 100, and the second piercing portion 103 of the flat circuit member 100 is located in the vicinity of the side wall portion 25. This facilitates the piercing of the distal end portion of the claw portion 26 into the second piercing portion 103 of the flat circuit member 100.

(ii) Case of Electric Connection to the Flat Circuit Member 110

By using a predetermined crimping machine in the state of FIG. 3B, the claw portion 26 is bent toward the bottom plate portion 22 such that the flat circuit member 110 is clamped between an outer surface 28 of the claw portion 26 and an inner edge portion 27 of the side wall portion 25. The conductor portion 112 of the flat circuit member 110 is partially urged against the inner edge portion 27 of the side wall portion 25 by the urging force of the claw portion 26, and the portion of the conductor portion 112 abuts against the inner edge portion 27 of the side wall portion 25, thereby making it possible to obtain stable electric contact between the connecting member 21 and the flat circuit member 110. Namely, the side wall portion 25 acts to clamp the flat circuit member 110 in cooperation with the claw portion 26.

Although, as described above, the method of connecting the connecting member 21 to the flat circuit member has been described separately with respect to the two examples, either connecting method should be selected appropriately in the actual connection by studying and taking into consideration the thickness, flexibility, and the like of the flat circuit member which is actually used. For example, the flat circuit member 110 having the thin conductor portions 102 is deflected greatly toward the bottom plate portion 22, as shown in FIG. 4B, since it has higher flexibility than the flat circuit member 100 having the thick conductor portions 102. Accordingly, in the case where the flat circuit member 110 is used, stable electric contact can be easily obtained by partially pressing the conductor portion against the side wall portion 25 by the claw portion 26 rather than by causing the claw portion 26 to pierce the conductor portion so as to obtain electric contact, as shown in FIG. 4A.

It should be noted that insofar as contact between the connecting member 21 and the flat circuit member can be effected smoothly and reliably, at the time of connecting the connecting member 21 to the flat circuit member, a tensile force or a pressing force may be applied, as required, to the flat circuit member from a direction substantially horizontal to the direction of extension of the flat circuit member. Similarly, at the time of connecting the connecting member 21 to the flat circuit member, the position of the connecting member 21 may be moved, as required.

Because of its high flexibility the flat circuit member 110 is easily brought into contact with the upper surface (inner surface) of the bottom plate portion 22 as well, and if the conductor portion 112 is partially pressed against the bottom plate portion 22 as well by the distal end portion of the claw portion 26, it is possible to obtain further electric contact between the connecting member 21 and the conductor portion 112.

In addition, as described before, the conductor portion 112 of the flat circuit member 110 may be mounted in such a manner as to face the bottom plate portion 22 of the connecting member 21, but the insulating portion 111 of the flat circuit member 110 may be mounted in such a manner as to face the bottom plate portion 22. In the case where a first piercing portion of the flat circuit member 110 is penetrated by the claw portion 26 while the insulating portion 111 of the flat circuit member 110 faces the bottom plate portion 22, and the claw portion 26 is bent toward the bottom plate portion 22 such that such that the flat circuit member 110 is clamped between the outer surface 28 of the claw portion 26 and the inner edge portion 27 of the side wall portion 25, the flat circuit member 110 is partially urged against the inner edge portion 27 of the side wall portion 25 by the urging force of the claw portion 26, and the conductor portion 112 is brought into contact with the outer surface 28 of the claw portion 26. Therefore, with such a connecting method as well, it is possible to obtain stable electric contact between the connecting member 21 and the flat circuit member 110.

Figure 5:
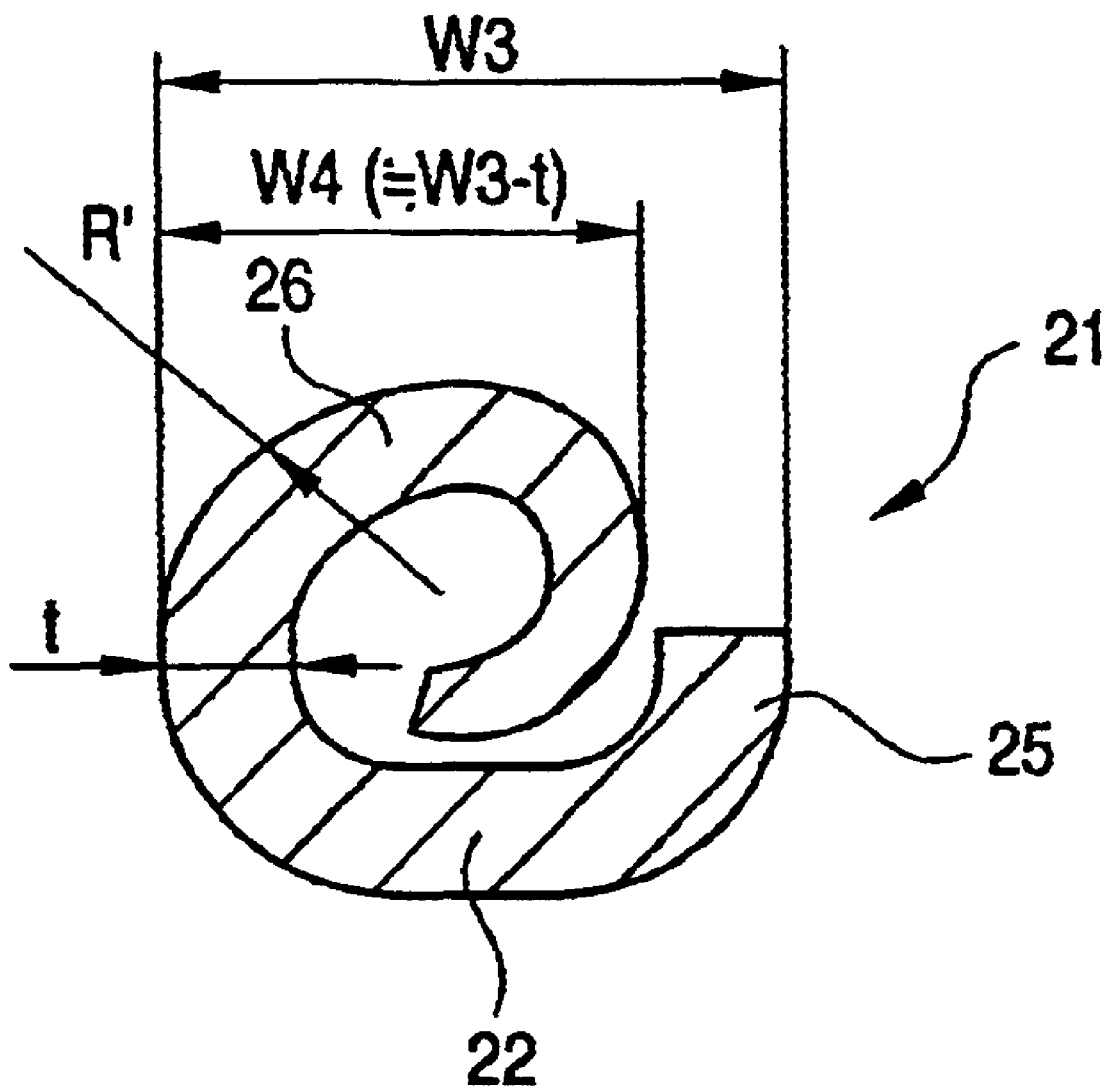
FIG. 5 is a diagram explaining dimensions of the connecting member.

As shown in FIG. 5, if it is assumed that the width of the connecting member 21 is W3, the bent width W4 of the claw portion 26 which is bent with a dimension of curl R' becomes approximately equal to a value which is obtained by subtracting the thickness t of the connecting member 21 from the just-mentioned width W3 (i.e., W4≈W3−t).

Figure 20:
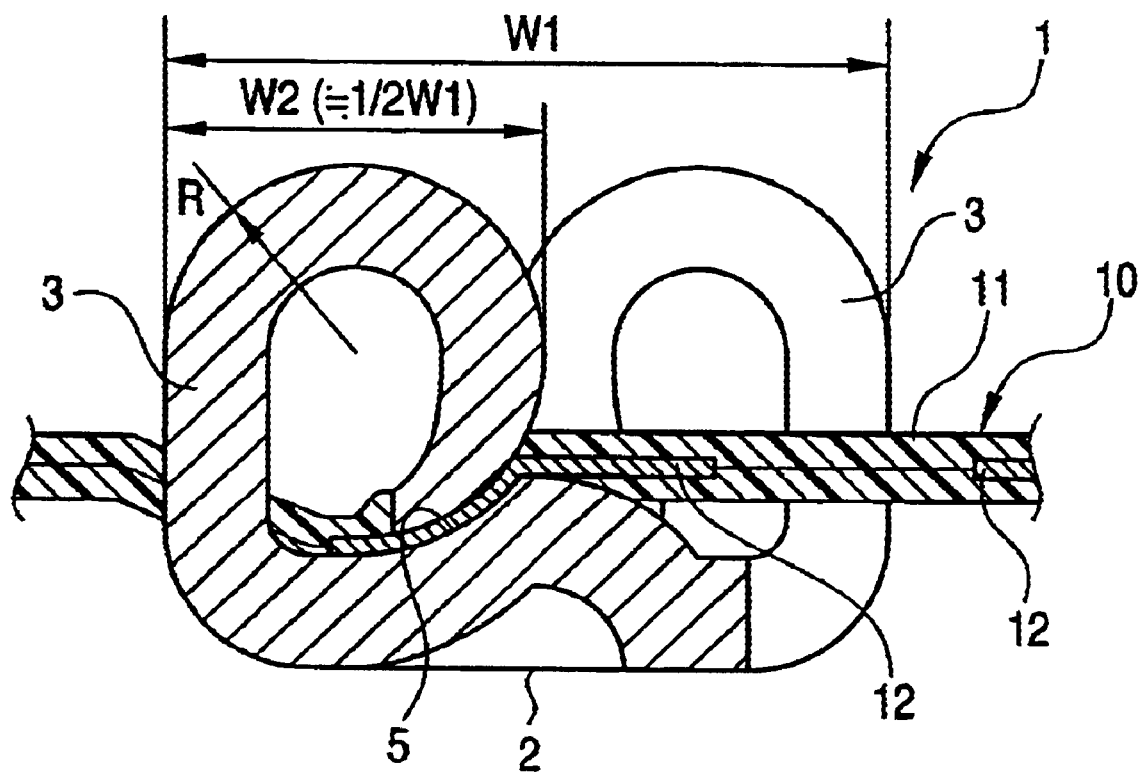
FIG. 20 is an enlarged cross-sectional view illustrating a state in which the connecting member shown in FIG. 18 is used.

If a comparison of the dimension of curl is made between the connecting member 21 of the invention and the connecting portion 1 of the related art by assuming a case where the width W3 of the connecting member 21 is equal to the width W1 of the connecting member 1 shown in FIG. 20 (i.e., W3=W1), the dimension of curl R' of the connecting member 21 can be set to be greater than the dimension of curl R of the connecting member 1 (i.e., R'>R). Namely, since leeway is provided in the range of the setting of the dimension of curl R', smooth curling of the claw portions becomes possible. Since there is leeway in the range of the setting of the dimension of curl R', in the invention the width W3 of the connecting member 21 can be made small by making the dimension of curl R' small. Accordingly, it is possible to design a compact connecting member. For this reason, even in cases where the interval between adjacent ones of a plurality of conductor portions is small in the flat circuit member and the width of each conductor portion is narrow, it is possible to obtain reliable electric contact between the conductor portions and the connecting member.

For example, in FIG. 4A, the claw portion 26 is bent such that the inner surface 29 and the outer surface 28 of the claw portion 26 is located on the inner side of the side wall portion 25. In order to obtain a large dimension of curl R' so as not to make the width W3 of the connecting member 21 narrow in this manner, it is preferable to locate the outer surface 28 of the claw portion 26 as close to the vicinity of the inner surface of the side wall portion 25 as possible. However, in a case where enlargement of the width W3 of the connecting member 21 is allowed by taking into consideration the width and the state of disposition of the conductor portions of the flat circuit member, the claw portion 26 may be bent such that the inner surface 29 of the claw portion 26 is located as close to the vicinity of the outer surface of the side wall portion 25 as possible.

The connecting member of the invention is applicable to various uses. For instance, if the material of the connecting member is appropriately selected so as to be provided with good solderability, the connecting member can be directly soldered to a mating member to be connected to, such as an electric circuit board and various devices, thereby making it possible to connect the flat circuit member to the mating member to be connected to. In this case, the bottom plate portion of the connecting member may be modified appropriately as to be used as a portion for soldering.

Referring to the drawings, a description will be given of modifications of the connecting member 21 in accordance with the first embodiment.

(First Modification)

Figure 6A:
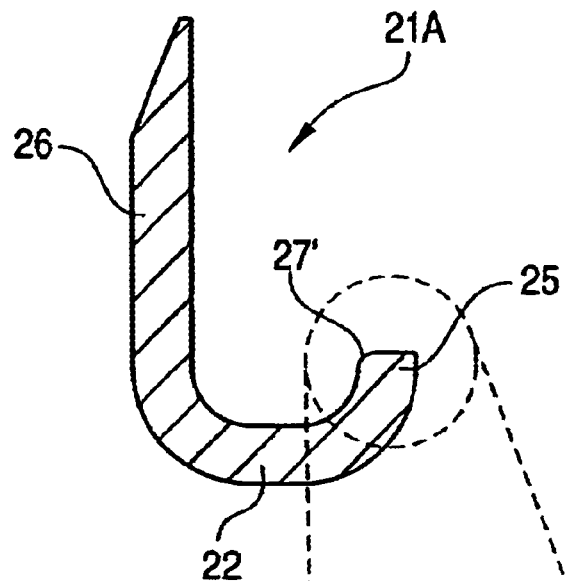
FIGS. 6A and 6B are diagrams illustrating a first modification of the connecting member shown in FIG. 1.
Figure 6B:
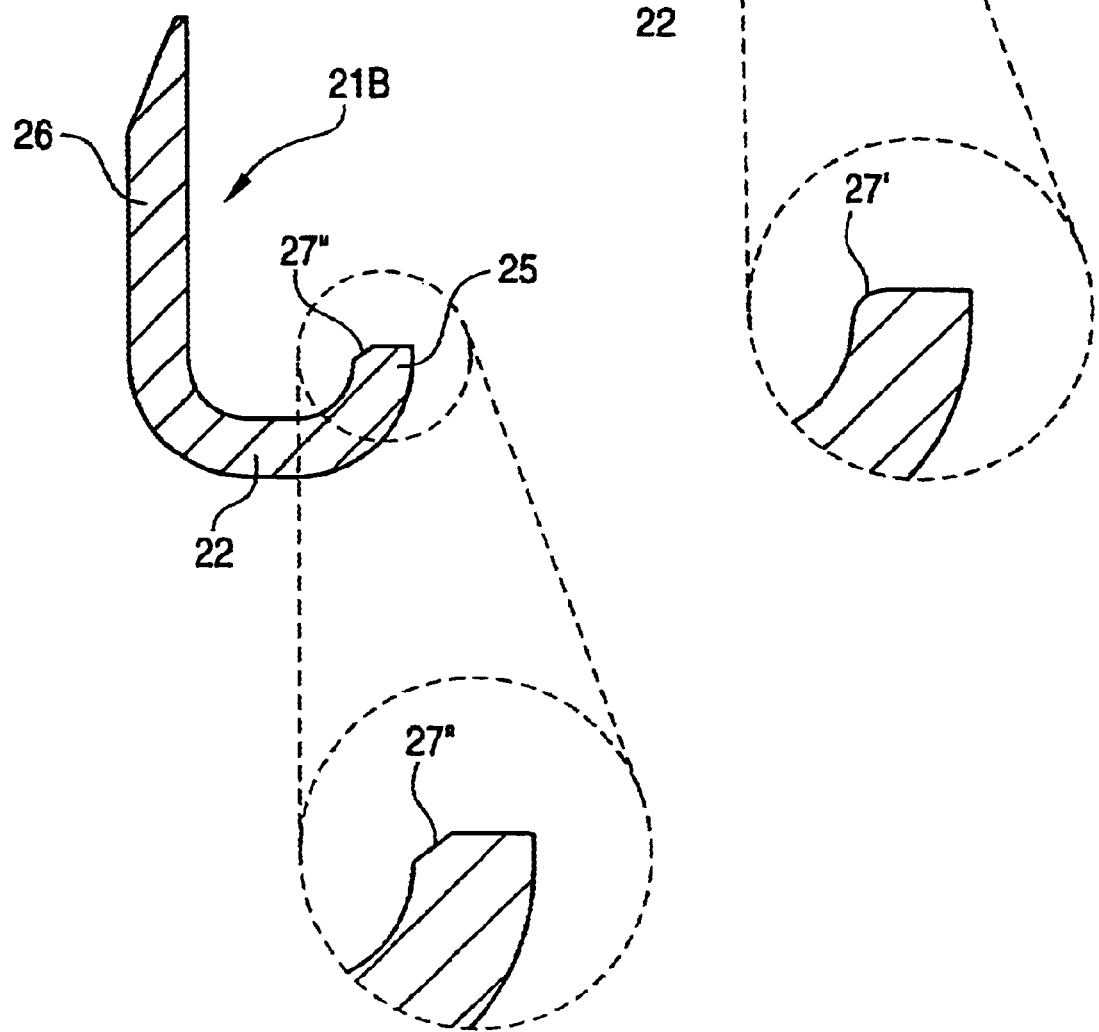

FIGS. 6A and 6B show a first modification of the connecting member 21 shown in FIG. 1, and specifically illustrate an example in which the inner edge portion 27 of the side wall portion 25 has been chamfered. As examples of chamfering, FIG. 6A shows a connecting member 21A in which a curved surface 27' has been formed on the inner edge portion of the side wall portion 25, while FIG. 6B shows a connecting member 21B in which an inclined surface 27" has been formed on the inner edge portion of the side wall portion 25.

Since the inner edge portion of the side wall portion 25 is chamfered, damage to or cutting of the flat circuit member is prevented reliably. This chamfering is applicable to either connecting member shown in FIG. 4A or 4B.

In the case where the curved surface 27' or the inclined surface 27" is formed on the connecting member shown in FIG. 4A, it is possible to reliably prevent damage to the insulating portion 101 of the flat circuit member 100. Furthermore, when the claw portion 26 is bent toward the bottom plate portion 22 such that the distal end portion of the claw portion 26 pierces the conductor portion 102 of the flat circuit member 100, it becomes difficult for the flat circuit member 100 to resist the stress whereby it is pulled toward the proximal side of the claw portion 26. For this reason, the flat circuit member 100 is likely to slide on the curved surface 27' or the inclined surface 27", so that a strain is likely produced in the portion 102a of the conductor portion 102 located on the inner side of the bent claw portion 26. Accordingly, since the force for holding the contact between the cross section of the conductor portion 102 and the inner surface 29 of the claw portion 26 becomes higher due to the resilient repellency of at least that portion 102a, it is possible to obtain stable electric contact between the connecting member 21 and the flat circuit member 100.

In the case where the curved surface 27' or the inclined surface 27" is formed on the connecting member shown in FIG. 4B, it is possible to reliably prevent damage to or cutting of the conductor portion 112 of the flat circuit member 110. Furthermore, when the claw portion 26 is bent toward the bottom plate portion 22 such that the flat circuit member 110 is clamped between the outer surface 28 of the claw portion 26 and the curved surface 27' or the inclined surface 27" of the side wall portion 25, it becomes difficult for the flat circuit member 110 to resist the stress whereby it is pulled toward the proximal side of the claw portion 26, and the flat circuit member 110 is capable of sliding smoothly on the curved surface 27' or the inclined surface 27". For this reason, the flat circuit member 110 having higher flexibility than the flat circuit member 100 shown in FIG. 4A is capable of undergoing large flexural deformation toward the bottom plate portion 22. Such deflection of the flat circuit member 110 is effective in the case where the conductor portion 112 is pressed against the side wall portion 25 by the distal end portion of the claw portion 26 so as to obtain contact.

(Second Modification)

Figure 7A:
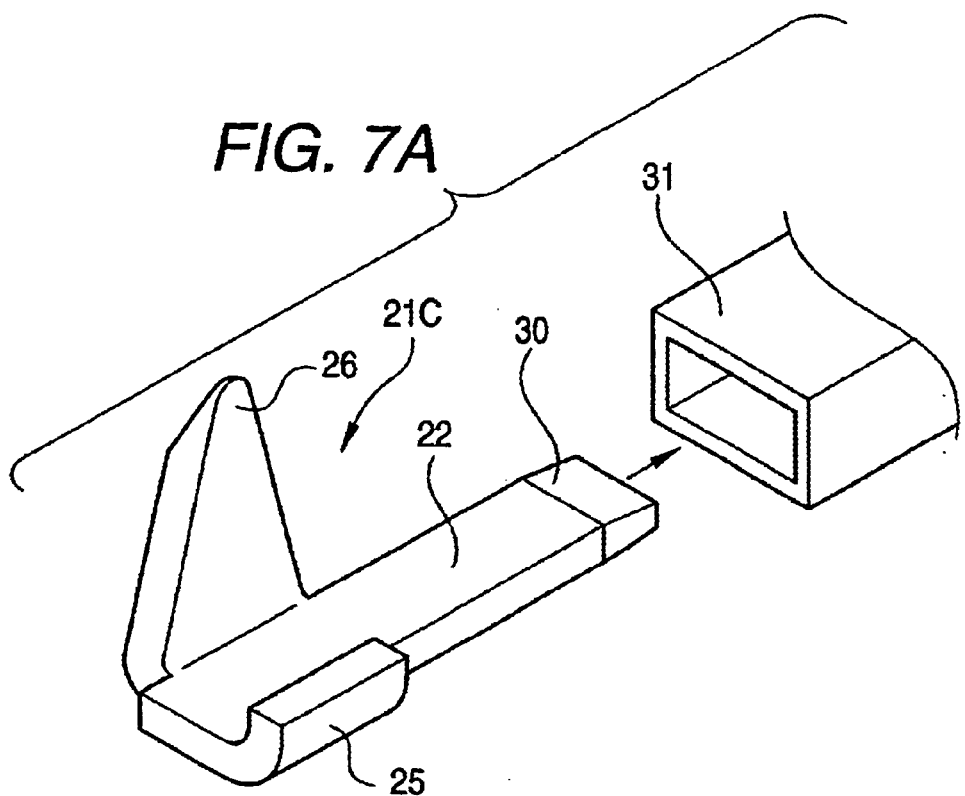
FIGS. 7A and 7B are diagrams illustrating a second modification of the connecting member shown in FIG. 1.
Figure 7B:
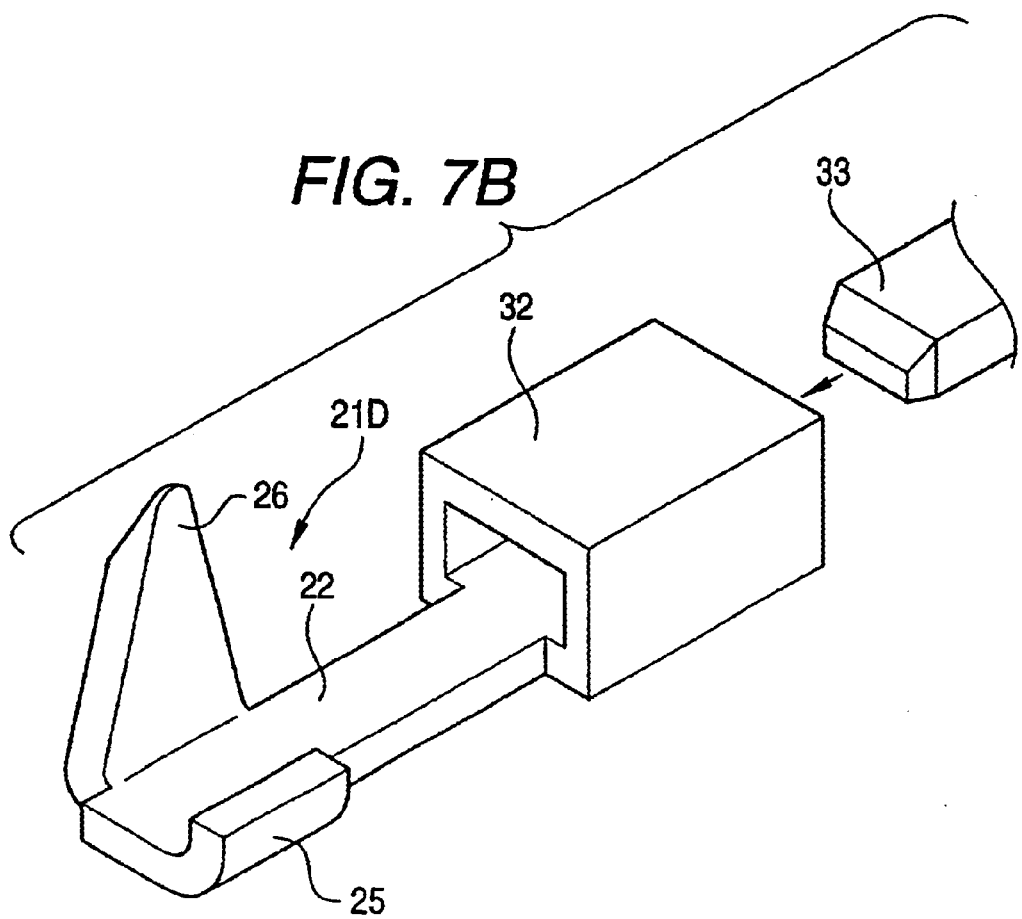

FIGS. 7A and 7B show a second modification of the connecting member 21 shown in FIG. 1. FIG. 7A shows a connecting member 21C in which a male terminal portion 30 connectable to a mating female terminal 31 is formed at one longitudinal end portion of the bottom plate portion 22 shown in FIG. 1. In addition, FIG. 7B shows a connecting member 21D in which a female terminal portion 32 connectable to a mating male terminal 33 is formed at one longitudinal end portion of that bottom plate portion 22. The flat circuit member having such a modified connecting member connected thereto is easily connected to another device having a mating terminal, and the range of application of the flat circuit member becomes wide.

It should be noted that each of the male terminal portion 30 and the female terminal portion 32 may be formed integrally with the connecting member or may be formed separately. However, they should preferably be formed integrally for the purpose of the lowering of the manufacturing cost through a decrease in the number of device parts of the connecting member and for the purpose of the improvement of strength. It goes without saying that the application of the first modification to this second modification is also effective.

(Third Modification)

Figure 8:
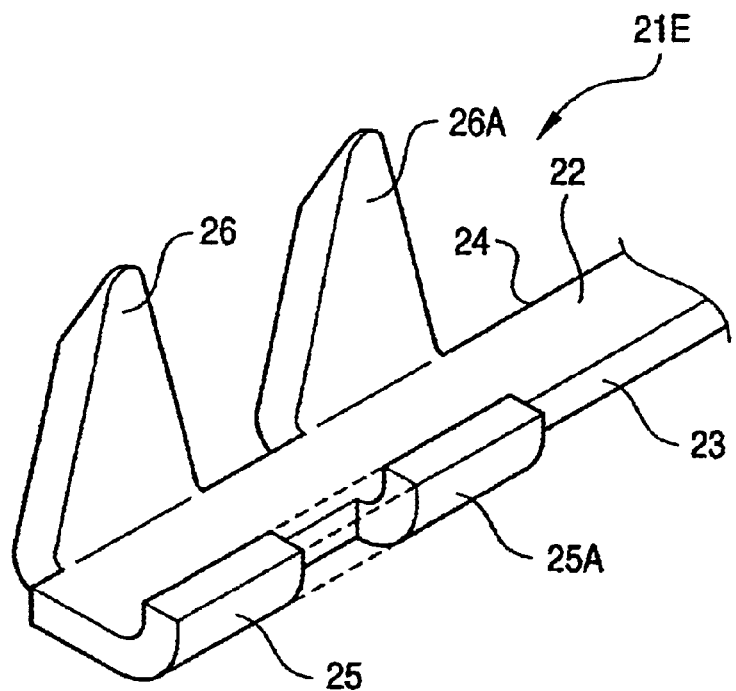
FIG. 8 is a diagram illustrating a third modification of the connecting member shown in FIG. 1.

FIG. 8 shows a third modification of the connecting member 21 shown in FIG. 1, and specifically shows a connecting member 21E which is provided with a plurality of claw portions and a plurality of side wall portions.

As shown in FIG. 8, a second side wall portion 25A extending upward from one side edge 23 of the bottom plate portion 22 substantially in parallel with the thickness direction of the bottom plate portion 22, as well as a second claw portion 26A extending upward from the other side edge 24 of the bottom plate portion 22 substantially in parallel with the thickness direction of the bottom plate portion 22 in such a manner as to oppose the side wall portion 25A, are further formed on the connecting member 21E in addition to the configuration of the connecting member shown in FIG. 1.

According to such a connecting member 21E, since electric contact with the conductor portion of the flat circuit member is formed at least at two portions, the reliability of electric contact improves. In addition, the connecting member 21E is effective in a case where a shortcircuiting circuit is formed for two independent conductor portions. It goes without saying that the application of the first modification and the second modification to this third modification is also effective.

It should be noted that a slit or a recessed portion may not be formed between the side wall portion 25 and the second side wall portion 25A as shown by the dotted lines in FIG. 8, and these side wall portions may be formed continuously without a break. The sidewall portion which is thus formed continuously without a break is preferable since its strength improves as compared with the case where the side wall portion 25 and the second side wall portion 25A are formed individually independently.

(Fourth Modification)

Figure 9:
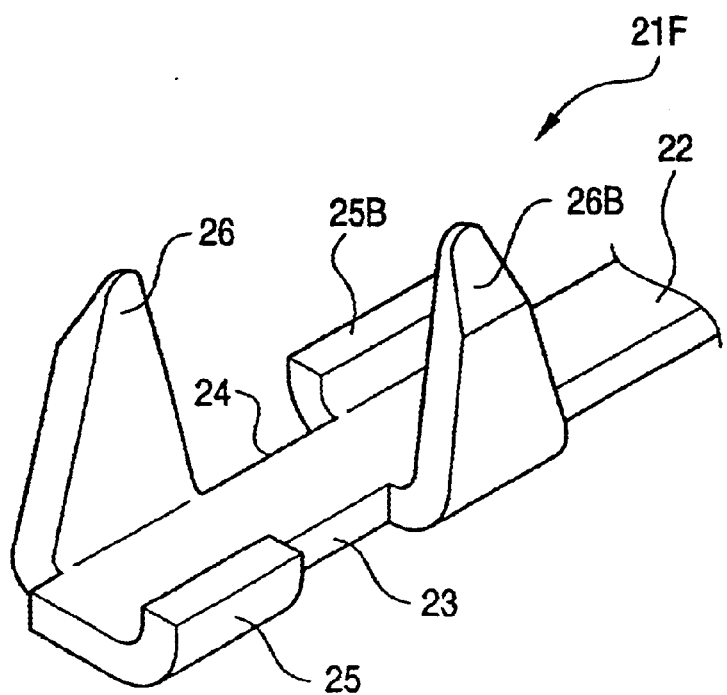
FIG. 9 is a diagram illustrating a fourth modification of the connecting member shown in FIG. 1.

FIG. 9 shows a fourth modification of the connecting member 21 shown in FIG. 1, and specifically shows a connecting member 21F which is provided with a plurality of claw portions and a plurality of side wall portions, but the positions where the second claw portion and the second side wall portion are formed differ in comparison with the connecting member 21E shown in FIG. 8.

As shown in FIG. 9, a second side wall portion 25B extending upward from the other side edge 24 of the bottom plate portion 22 substantially in parallel with the thickness direction of the bottom plate portion 22, as well as a second claw portion 26B extending upward from one side edge 23 of the bottom plate portion 22 substantially in parallel with the thickness direction of the bottom plate portion 22 in such a manner as to oppose the inner surface of the side wall portion 25B, are further formed on the connecting member 21F in addition to the configuration of the connecting member shown in FIG. 1.

According to such a connecting member 21F, in the same way as the connecting member 21E shown in FIG. 8, since electric contact with the conductor portion of the flat circuit member is formed at least at two portions, the reliability of electric contact improves. In addition, the connecting member 21F is effective in a case where a shortcircuiting circuit is formed for two independent conductor portions. It goes without saying that the application of the first to third modifications to this fourth modification is also effective.

Figure 10:
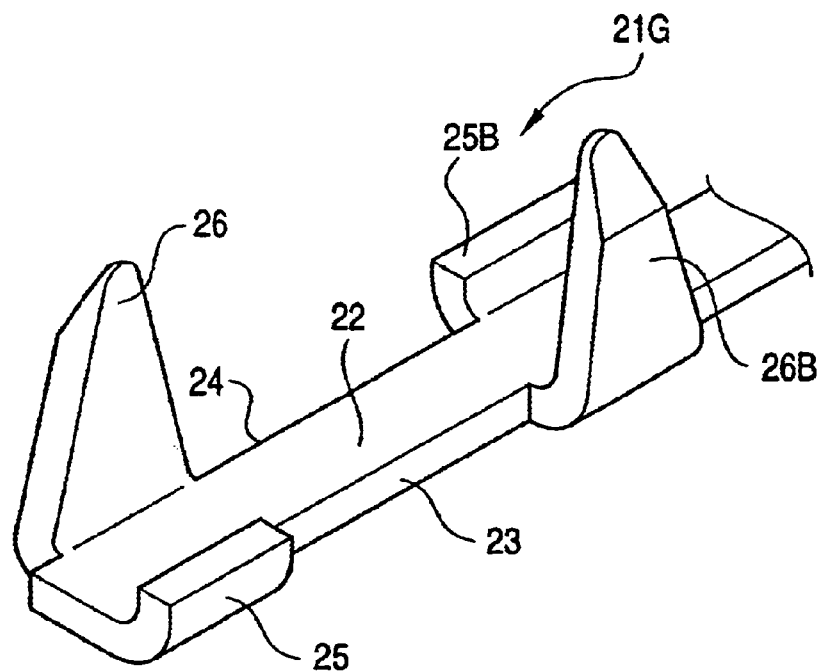
FIG. 10 is a diagram illustrating a fifth modification of the connecting member shown in FIG. 1.

FIG. 10 shows a fifth modification of the connecting member 21 shown in FIG. 1, and specifically shows a connecting member 21G which is provided with a plurality of claw portions and a plurality of side wall portions. However, as compared with the connecting member 21F, the second claw portion 26B and the second side wall portion 25B are respectively provided at positions further spaced apart from the side wall portion 25 and the claw portion 26 in the longitudinal direction of the bottom plate portion 22.

With such a connecting member 21G, since the second claw portion 26B and the second side wall portion 25B are respectively spaced apart a predetermined distance from the side wall portion 25 and the claw portion 26, this arrangement is effective in connection to two flat circuit members, for example. It goes without saying that the application of the first to fourth modifications to this fifth modification is also effective.

Second Embodiment

Figure 11:
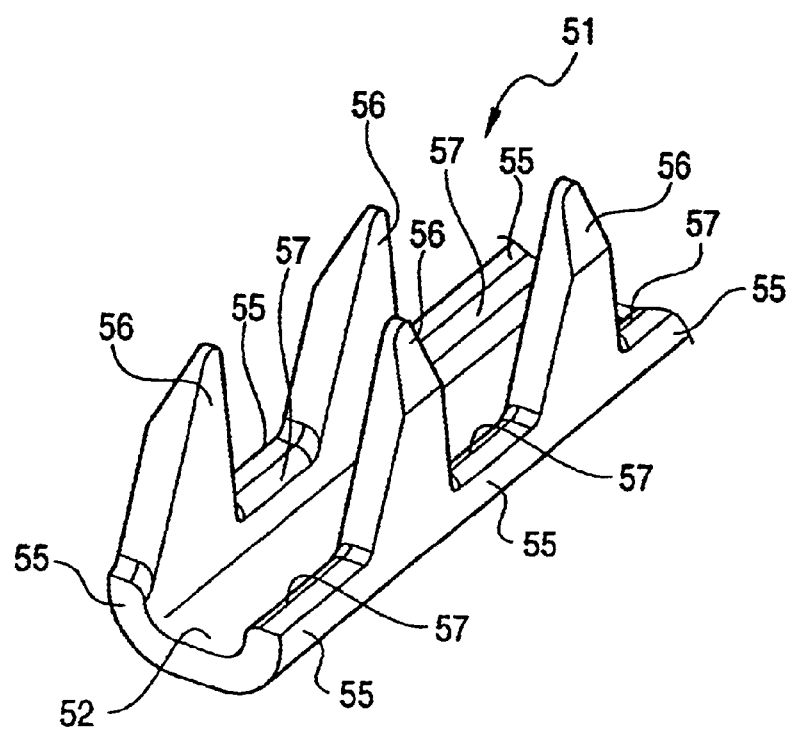
FIG. 11 is a perspective view illustrating the configuration of the connecting member in accordance with a second embodiment of the invention.
Figure 12:
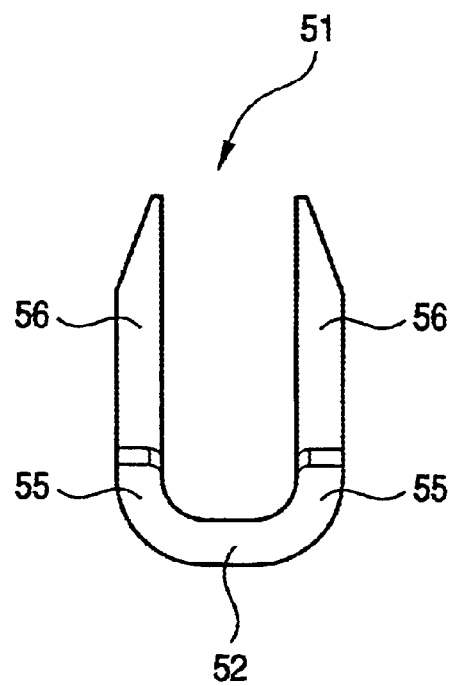
FIG. 12 is a side elevational view taken in the longitudinal direction of the connecting member shown in FIG. 11.
Figure 13:
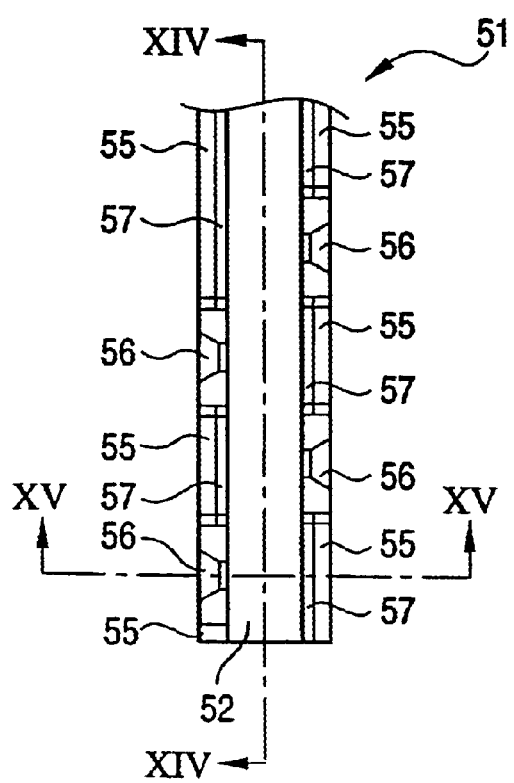
FIG. 13 is a top view of the connecting member shown in FIG. 11.
Figure 14:
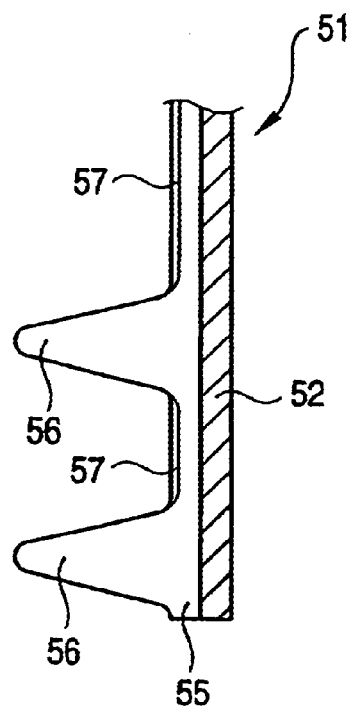
FIG. 14 is a cross-sectional view taken in the direction of arrows along line XIV—XIV in FIG. 13.
Figure 15:
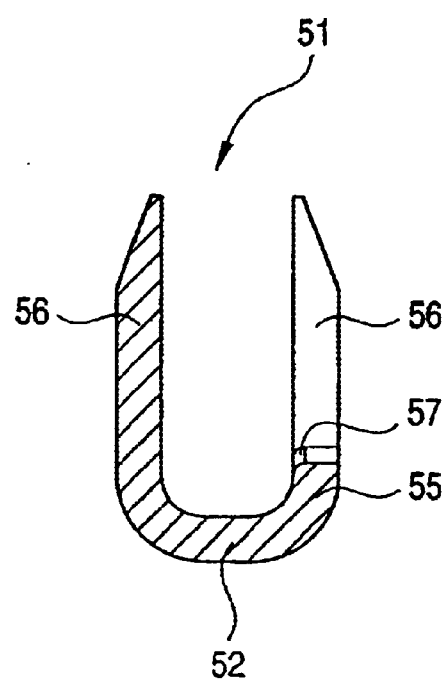
FIG. 15 is a cross-sectional view taken in the direction of arrows along line XV—XV in FIG. 13.
Figure 16:
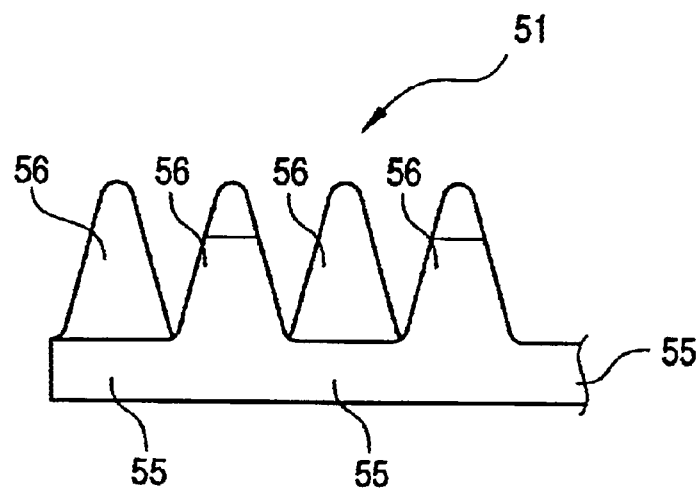
FIG. 16 is a side elevational view taken in the widthwise direction of the connecting member shown in FIG. 11.
Figure 17:
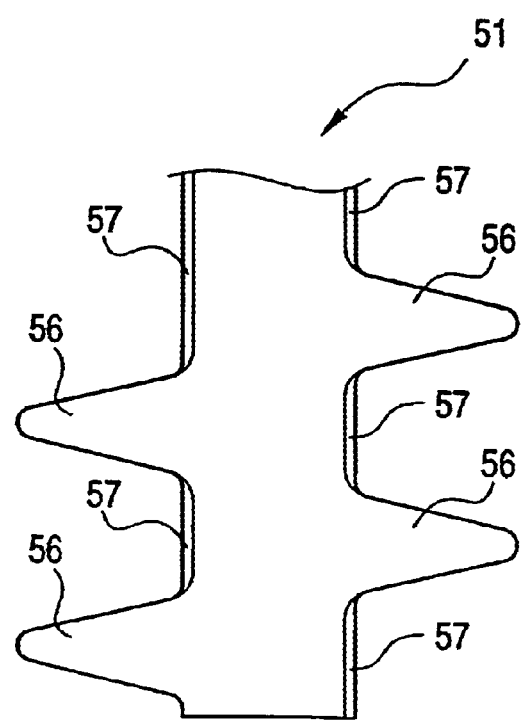
FIG. 17 is a development view of the connecting member shown in FIG. 11
Figure 18:
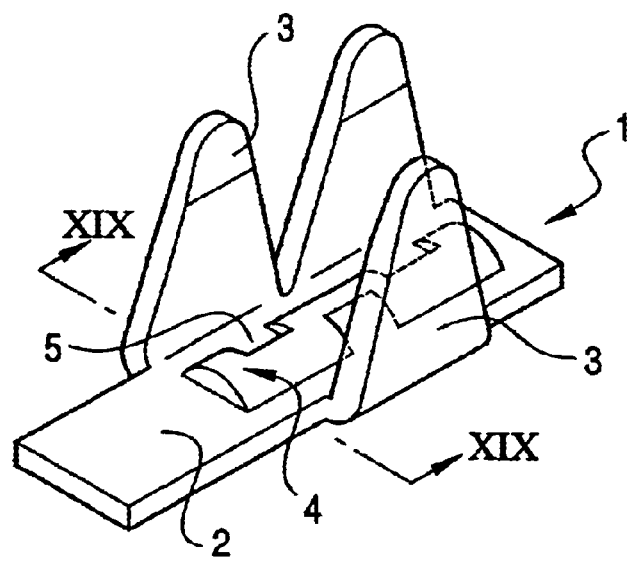
FIG. 18 is a perspective view illustrating a conventional connecting member.
Figure 19:
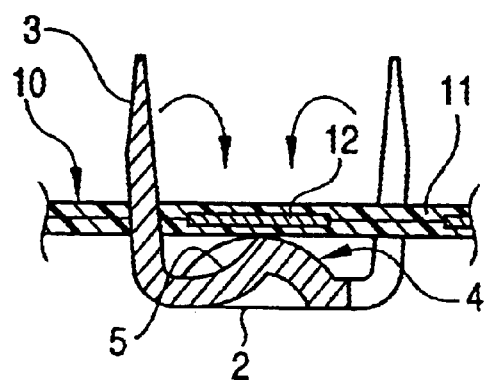
FIG. 19 is a cross-sectional view, taken in the direction of arrows along line XIX—XIX, of the connecting member shown in FIG. 18 and illustrating the cross section of a flat circuit member.

FIG. 11 is a perspective view illustrating the configuration of a connecting member 51 in accordance with a second embodiment of the invention. FIG. 12 is a side elevational view taken in the longitudinal direction of the connecting member 51 shown in FIG. 11. FIG. 13 is a top view of the connecting member 51 shown in FIG. 11. FIG. 14 is a cross-sectional view taken in the direction of arrows along line XIV—XIV in FIG. 13. FIG. 15 is a cross-sectional view taken in the direction of arrows along line XV—XV in FIG. 13. FIG. 16 is a side elevational view taken in the widthwise direction of the connecting member 51 shown in FIG. 11. FIG. 17 is a development view of the connecting member 51 shown in FIG. 11.

The whole of the connecting member 51 is integrally formed by subjecting an appropriate electrically conductive metal plate to press forming. The connecting member 51 is an embodiment of the modification of the first embodiment by taking into consideration the above-described first to fifth modifications. A plurality of wide wall portions 55 respectively extend upward from both widthwise side edges of a bottom plate portion 52 substantially in parallel with the thickness direction of the bottom plate portion 52, and a plurality of claw portions 56 respectively extend from both widthwise side edges of the bottom plate portion 52 in such a manner as to respectively oppose the plurality of side wall portions 55.

As can be seen from FIGS. 13 and 16, for example, the plurality of side wall portions 55 and the plurality of claw portions 56 are respectively arranged alternately (i.e., in a staggered manner) on both side edges of the bottom plate portion 52 along the longitudinal direction of the bottom plate portion 52. In addition, as can be seen from FIGS. 11 and 17, a slit or a recessed portion is not provided between each of the plurality of side wall portions 55 and each of the plurality of claw portions 56 which are juxtaposed alternately at each side edge of the bottom plate portion 52, and the side wall portions 55 and the claw portions 56 are formed continuously. For this reason, the structure of the connecting member 51 is simplified, as shown in FIGS. 16 and 17, for example. It is effective to apply these peculiar structures of the second embodiment to the first embodiment and the first to fifth modifications. It should be noted that the inner edge portions of the respective side wall portions 55 are chamfered, and curved surfaces or inclined surfaces 57 are formed thereon.

The connection between the connecting member 51 and the flat circuit member can be readily surmised from the details of the first embodiment described with reference to FIGS. 1A to 6B, so that a description thereof will be omitted. In addition, since the operation and the like based on the configuration of the connecting member 51 can also be readily surmised from the description of the above-described first embodiment and various modifications, so that a description thereof will be omitted.

It should be noted that the invention is not limited to the above-described embodiments and various modifications, and modifications, improvements, and the like are possible, as required.

The bottom plate portion, side wall portion(s), and claw portion(s) of each of the above-described connecting members may be formed integrally by welding, an electrically conductive adhesive agent, or the like after being respectively formed separately insofar as they are made of appropriate metals which are electrically conductive.

In addition, in each embodiment and modification, a description has been given of an example in which the side wall portion(s) and the claw portion(s) extend upward substantially in parallel with the thickness direction of the bottom plate portion. However, the invention is not limited to this example, and the direction in which the side wall portion(s) and the claw portion(s) extend from the bottom plate portion is arbitrary insofar as the invention can be attained.

In addition, the materials, shapes, sizes, forms, numbers, places of disposition, and the like of the bottom plate portion, side wall portion(s), claw portion(s), and the like illustrated by way of example in the above-described embodiments and modifications are arbitrary and are not limited insofar as the invention can be attained.

As described above, in accordance with the invention, even in a case where the interval between adjacent ones of a plurality of conductor portions in the flat circuit member is small and the width of each conductor portion is narrow, it is possible to reliably establish electric connection to the conductor portions and ensure stable connection.

In addition, in accordance with the invention, damage to or cutting of the flat circuit member is prevented reliably by chamfering the inner edge portion of the side wall portion of the connecting member.

What is claimed is:

1. The connecting member for a flat circuit member, comprising:

a bottom plate portion;

at least one side wall portion extending upward from one side edge of the bottom plate portion; and at least one claw portion extending from the other side edge of the bottom plate portion so as to oppose to the side wall portion, wherein the claw portion penetrates a portion of the flat circuit member having a conductor portion in a thickness direction of the flat circuit member, and wherein the claw portion is bent such that a portion of the flat circuit member is clamped between an outer surface of the claw portion and an inner edge portion of the side wall portion so as to obtain electric contact with the conductor portion.

2. The connecting member according to claim 1, wherein the inner edge portion of the side wall portion is chamfered.

* * * * *